United States Patent [19]

Hetyei

[11] Patent Number: 4,518,964
[45] Date of Patent: May 21, 1985

[54] PULSE ARRIVAL TIME DETERMINING DEVICE, USE THEREOF IN DISTANCE-MEASURING EQUIPMENT AND MEASURING EQUIPMENT COMPRISING SUCH A DEVICE

[75] Inventor: Joseph Hetyei, Paris, France

[73] Assignee: Thomson, CSF, Paris, France

[21] Appl. No.: 337,367

[22] Filed: Jan. 6, 1982

[30] Foreign Application Priority Data

Jan. 9, 1981 [FR] France ................ 81 00315

[51] Int. Cl.³ .................. G01S 13/76; G01S 7/28
[52] U.S. Cl. .................... 343/7.3; 343/17.1 R
[58] Field of Search ........ 343/5 CF, 7.3, 17.1 R, 343/13 R, 7 R, 6.5 R, 5 R, 5; 324/76; 328/105, 109, 132; 307/517, 514, 362, 354; 368/113, 118, 119, 120; 367/98

[56] References Cited

U.S. PATENT DOCUMENTS

| | | | |
|---|---|---|---|
| 3,249,867 | 5/1966 | Hattersley et al. | 368/120 |
| 3,351,864 | 11/1967 | Scribner | 307/514 X |
| 3,407,355 | 10/1968 | Clark et al. | 343/5 R |
| 3,543,156 | 11/1970 | Hall et al. | 368/113 |
| 3,543,159 | 11/1970 | Slayden et al. | 368/119 X |
| 3,689,922 | 9/1972 | Phillips, Jr. | 343/5 CF X |
| 3,715,752 | 2/1973 | Garret | 343/7.3 |
| 3,716,857 | 2/1973 | Le Grand | 343/17.1 R X |
| 3,719,943 | 3/1973 | Applegarth | 343/7.3 |
| 3,728,630 | 4/1973 | Strenglein | 343/6.5 R |
| 3,824,464 | 7/1974 | Rotier et al. | 368/118 |
| 3,829,858 | 8/1974 | Bergkvist | 343/5 CF X |
| 3,838,422 | 9/1974 | MacArthur | 343/5 CF X |
| 3,869,207 | 3/1975 | Hermet et al. | 343/7.3 X |
| 3,936,823 | 2/1976 | Weber | 343/7.3 |
| 4,000,466 | 12/1976 | Scouten et al. | 368/113 |
| 4,107,675 | 8/1978 | Sellers et al. | 343/6.5 R X |
| 4,245,332 | 1/1981 | Schaefer | 367/98 |

OTHER PUBLICATIONS

Woodard, O. C. Time Delay Measuring System, 4/11/67, vol. 9, No. 11, p. 1541.

Primary Examiner—Maynard R. Wilbur
Assistant Examiner—Brian Steinberger
Attorney, Agent, or Firm—Cushman, Darby & Cushman

[57] ABSTRACT

A device for determining the arrival time of a fast or slow rising front pulse is provided comprising a first comparator to which are applied at its inputs a delayed pulse and an attenuated non-delayed pulse, and a second comparator connected in parallel across the first, through an AND logic circuit receiving the pulse applied to the input of the device through a circuit connected to one of its inputs, acting on the noise and/or the signal.

This circuit is either a low-pass filter or a divider circuit.

8 Claims, 28 Drawing Figures

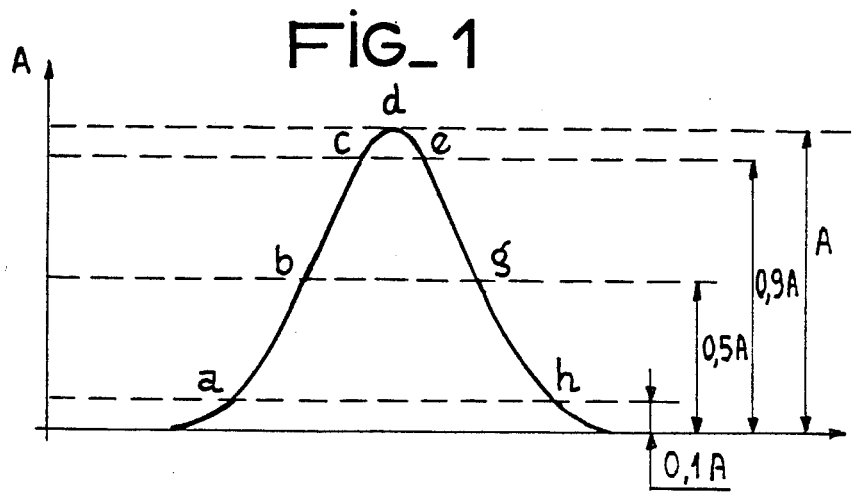
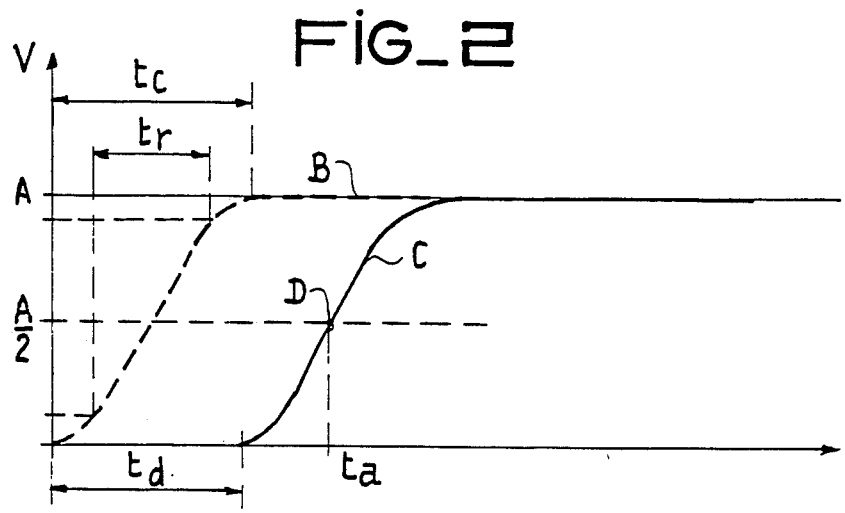
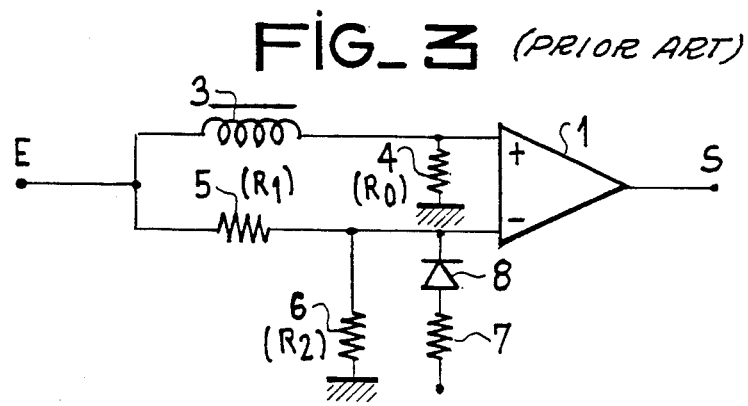

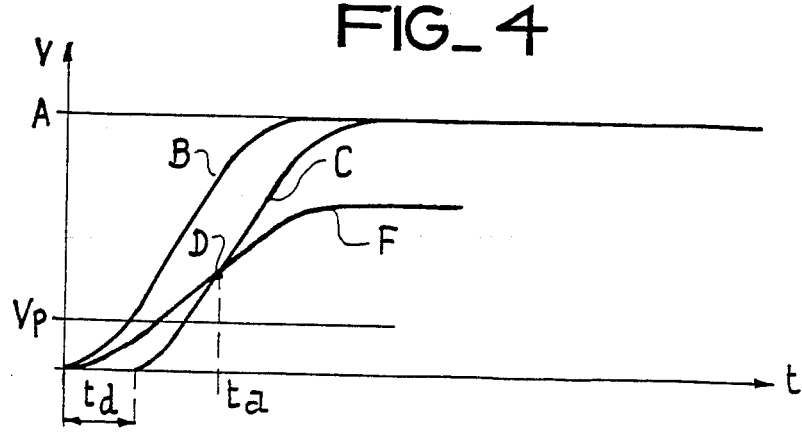
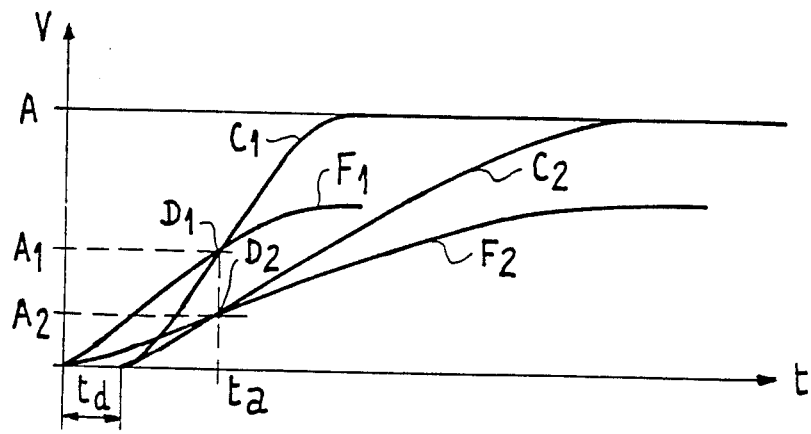
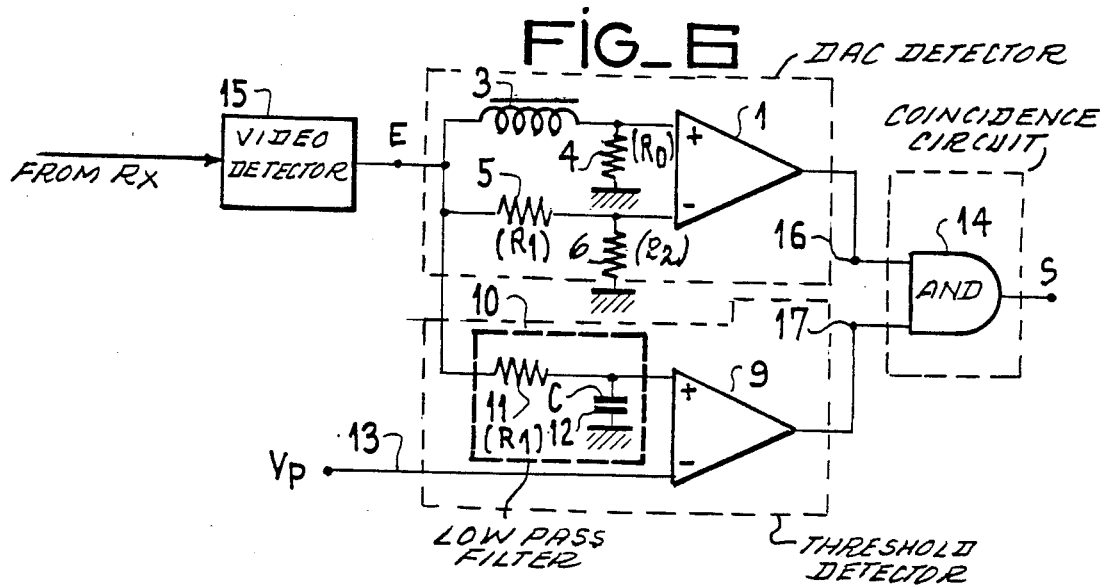

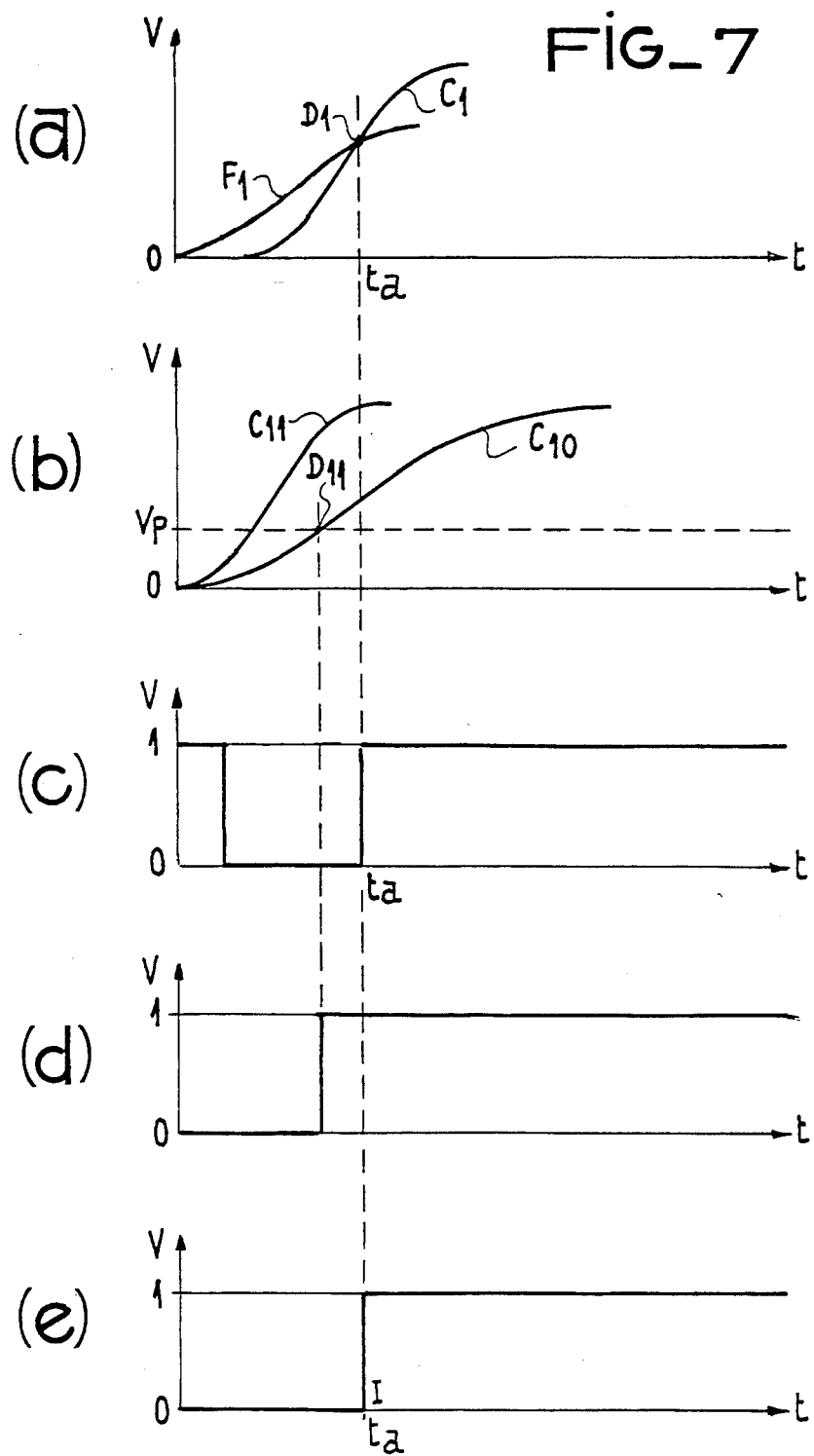

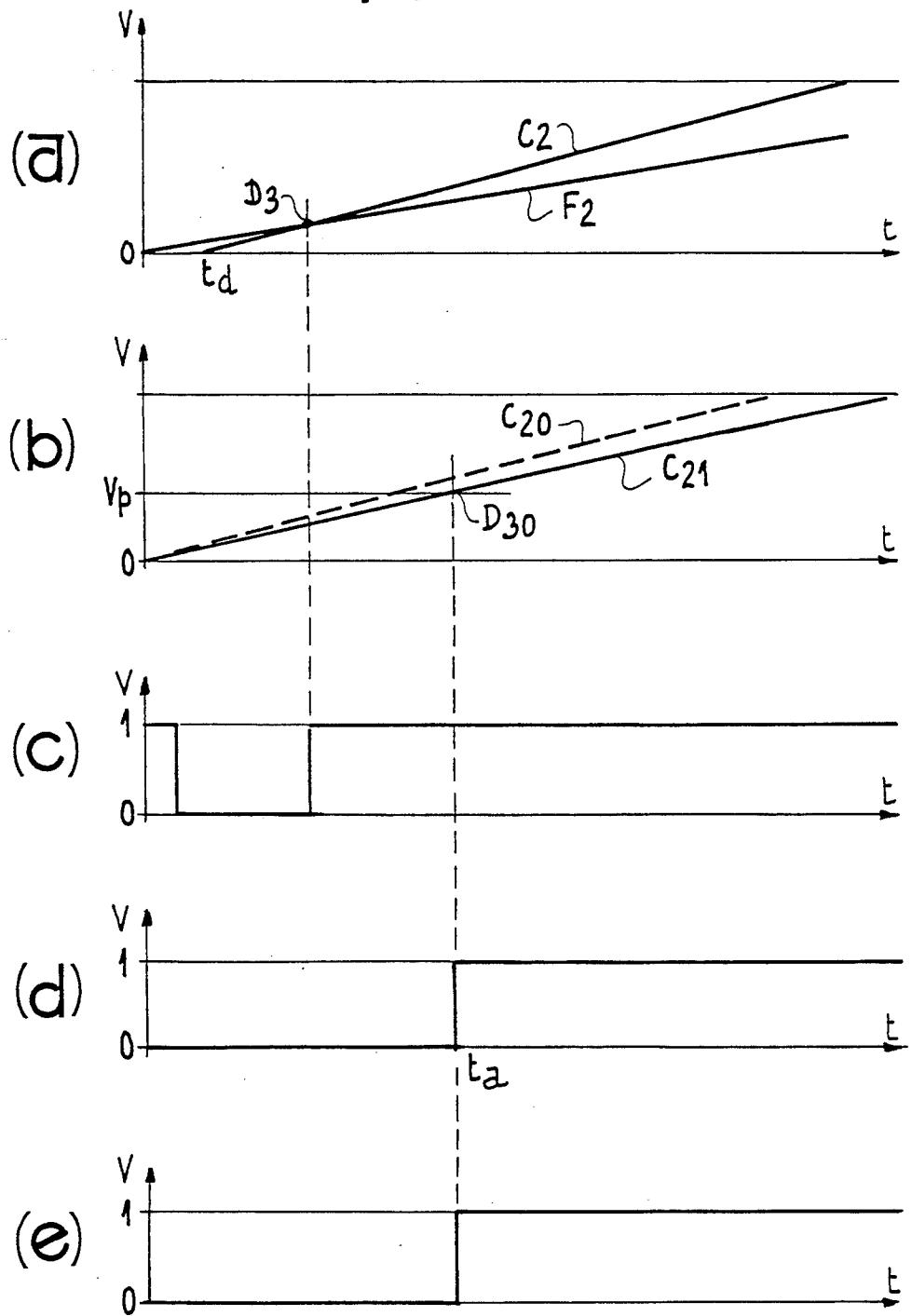

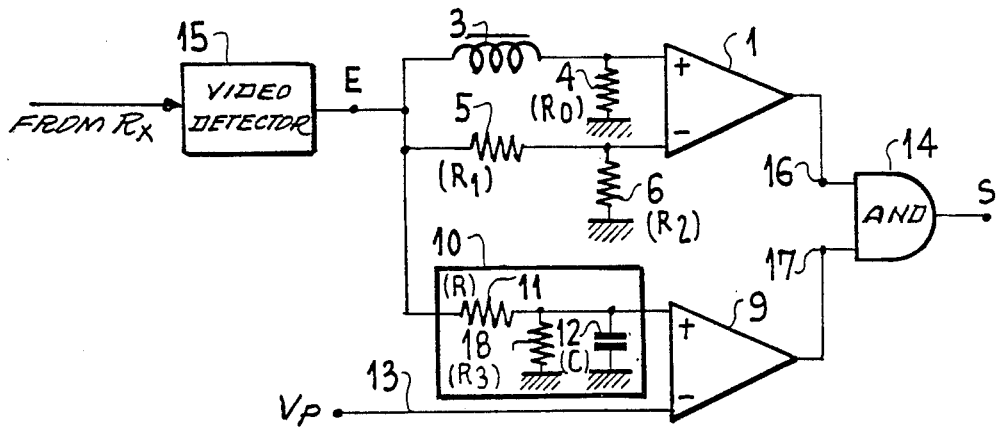
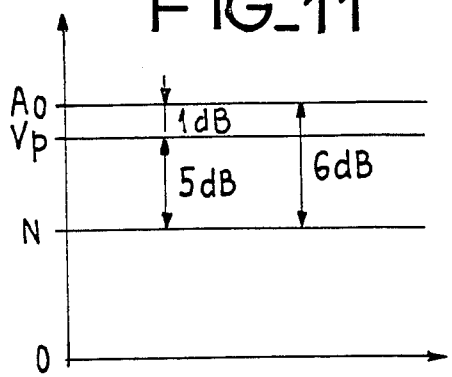
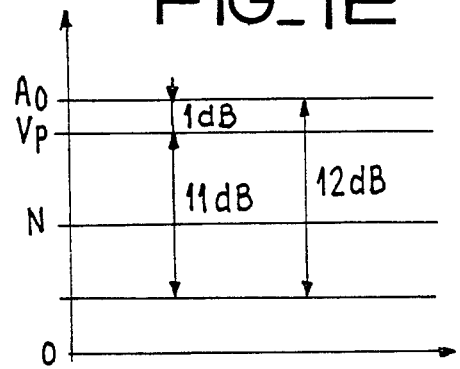
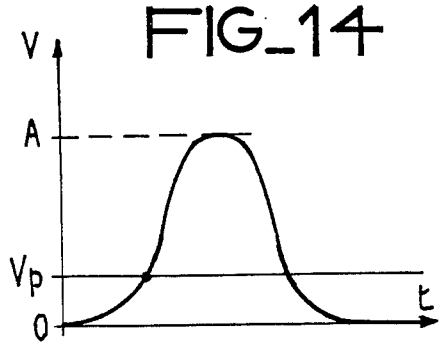
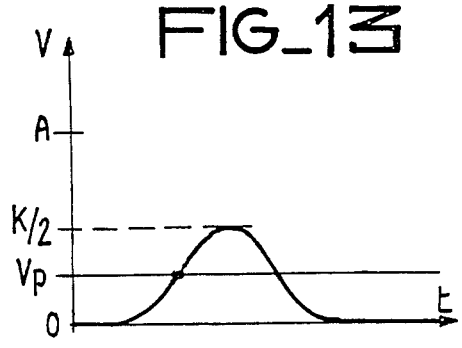

FIG_10
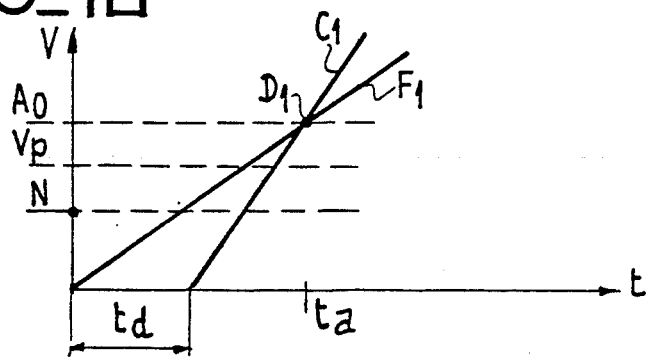
(a)
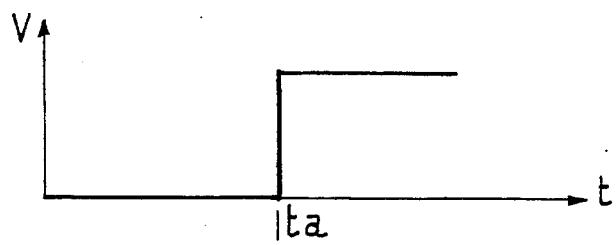
(b)
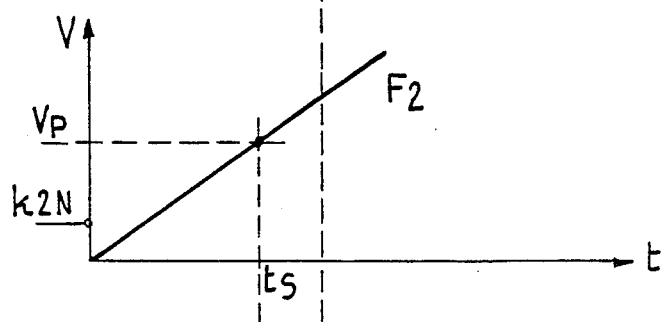
(c)
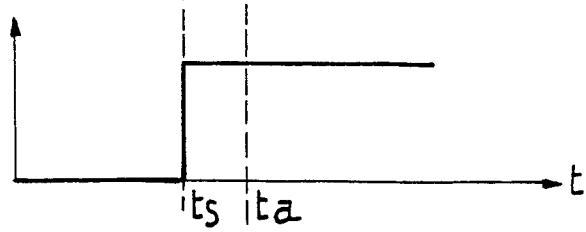
(d)
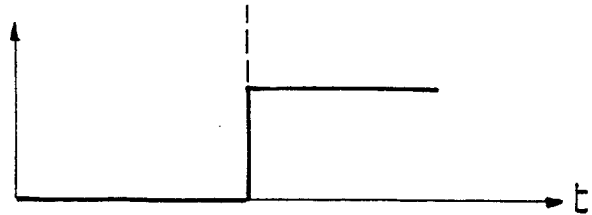
(e)

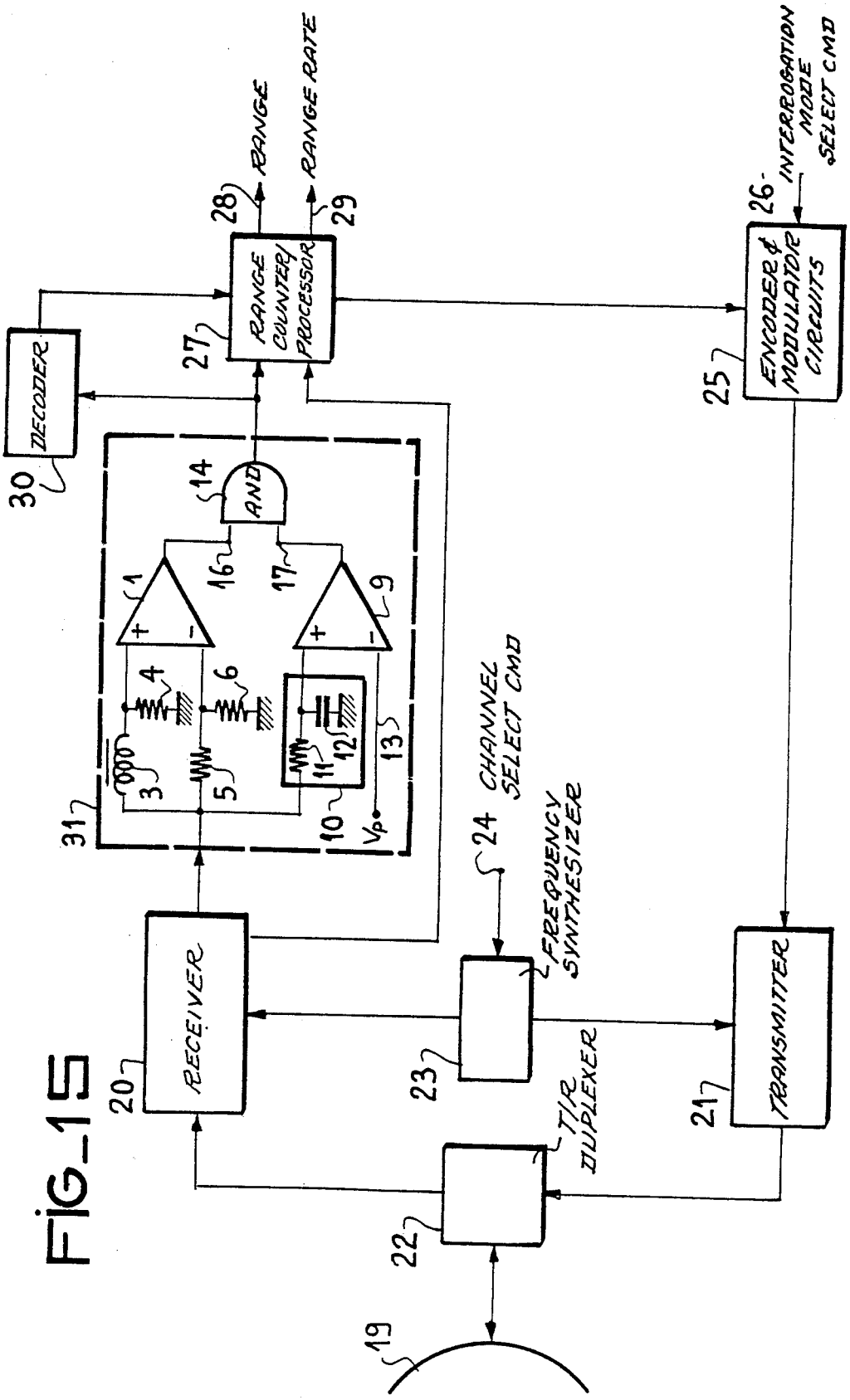
FIG_15

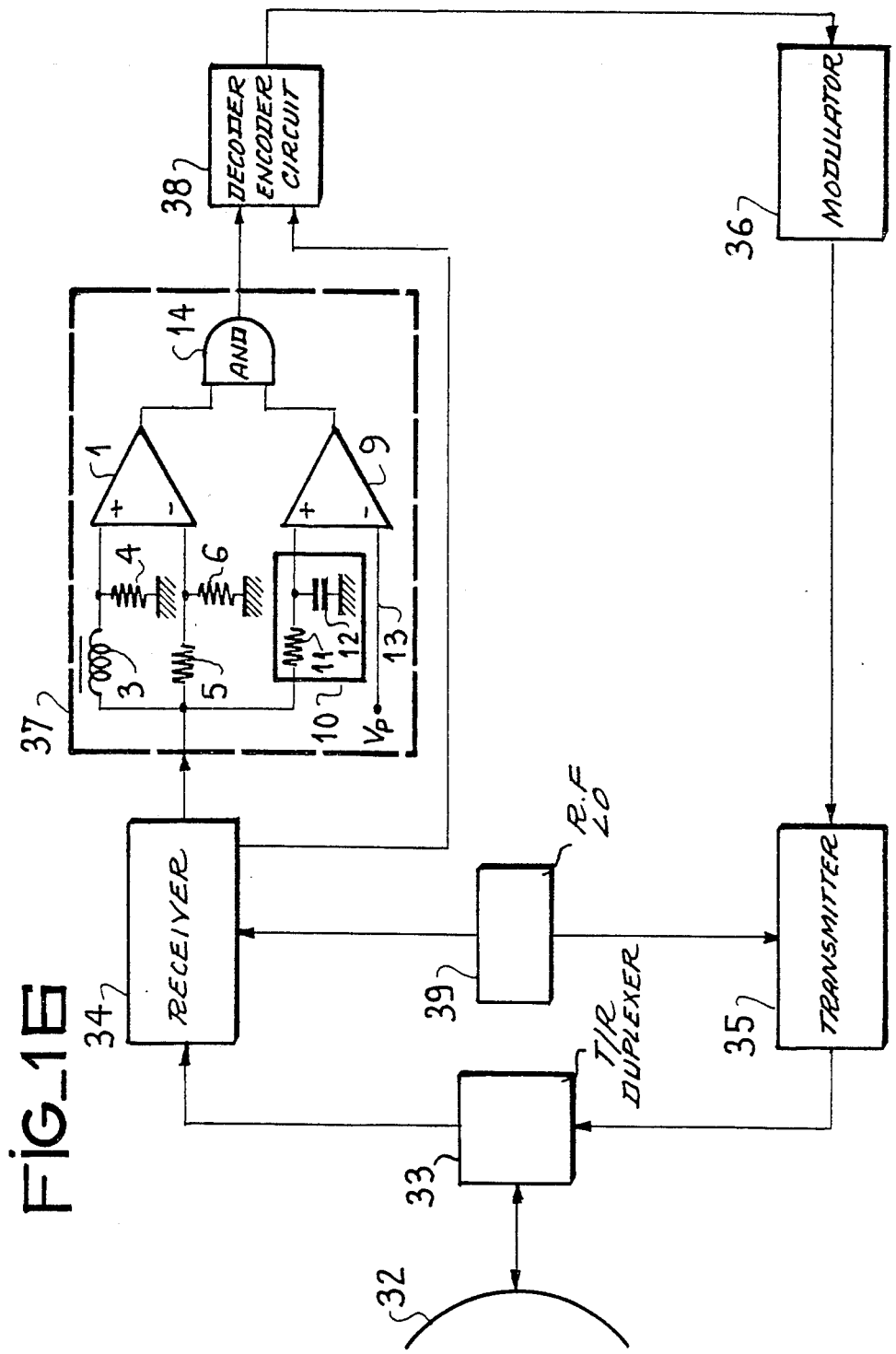

PULSE ARRIVAL TIME DETERMINING DEVICE, USE THEREOF IN DISTANCE-MEASURING EQUIPMENT AND MEASURING EQUIPMENT COMPRISING SUCH A DEVICE

BACKGROUND OF THE INVENTION

The present invention relates to a device for determining the arrival time of pulses, principally in the case where these pulses have different rising fronts. The invention also relates to the use of such a device in distance-measuring equipment or DME and the equipment comprising such a device.

In some equipment belonging to the class of electromagnetic detection equipment and in particular for distance-measuring equipment, the pulses used must conform to certain norms and definitions.

FIG. 1 shows the general shape of the pulses used in a DME for which some definitions are given below.

The amplitude of the pulse is the maximum amplitude A of its envelope. The duration of the pulse is the time interval between the points b and g, situated respectively on the leading and trailing edges of the pulse at the 0.5A level.

The rising time of the pulse is the total rising time measured between points a, at 0.1A on the leading edge of the envelope of the pulse and c at 0.9A on the same leading edge.

The quench time of the pulse is the total quench time measured between points e, at 0.9A on the trailing edge of the envelope of the pulse and h, at 0.1A on this same trailing edge.

Since these pulses are used for determining the distance separating a moving object from any point whatsoever, a beacon for example, the time of arrival of such a pulse in the measuring equipment, not only onboard the moving object but also on the ground, must be known accurately and in particular for avoiding the errors which would result from a modification of the shape of the signal received due to parasites. Of course, the measurement of distance is not limited to airborne moving bodies; it may also apply to moving bodies on land or at sea. This determination is particularly important in distance-measuring equipment or DME, wherein it is desired to know the distance between an airborne moving body and a ground station which may be the landing point for the aircraft.

A device for determining the time of arrival of pulses is known, used in a so-called "en route" DME which seeks to find the distance between an aircraft in flight and a station.

This en route DME equipment uses Gaussian-shape pulses with a rising front of the order of 2.5 μs between 10% and 90%, in fact between 1 and 3 μs. The determination or also the detection of the arrival time of a pulse of this type is achieved by means of an amplitude comparator circuit working out the decision at mid-height of the pulse. The prior-art device comprises then a peak detector which takes the peak value of the pulse then applies half of this peak value to the input of an amplitude comparator which receives at the other input the pulse suitably delayed by a delay line. FIG. 2 gives a time diagram of the execution of this measurement, representing the amplitude V of the pulse used with respect to the time t. Curve B shows the pulse used in the equipment which reaches its maximum amplitude A after a time tc, greater than time tr, called rise time, in accordance with the above-recalled norm. Curve C shows the pulse delayed by time td, td being approximately equal to time tc. The arrival time ta of the pulse is marked by the point D, where the pulse reaches half of the peak value, i.e. ½A.

However, and principally when it is desired to determine the distance between the aircraft and the ground station with greater accuracy, in the case where the ground station is the landing point of the aircraft, this device is not accurate enough for it becomes sensitive to external parasite phenomena, in fact to the reflections due to the multipaths which cause modifications of the shape of the signal received and this until the peak value of the pulse is obtained, i.e. until switching of the comparator used in the determination device. These modifications in the shape of the curve lead to erroneous positioning of point D.

To remedy these disadvantages, a device has been proposed corresponding to another method for determining the arrival time of pulses and working with pulses having a faster rising front, generally of the order of 1 μs.

A thus improved device is known under the name of DAC (delay and compare), that is to say that the operation of this circuit is based on a delay and a comparison.

FIG. 3 shows such a device and FIG. 4 the pulses used in an amplitude-time diagram.

The device for determining the arrival time of a pulse, improved with respect to the one previously mentioned, comprises a comparator in the form of a differential amplifier 1 one input of which, generally the positive input, is fed from the input E of the device by a circuit comprising a delay line 3 matched to a characteristic resistance 4, of value Ro and the negative input of which is connected to the input E of the device through a circuit comprising a voltage divider formed by a resistor 5, of value R1, in series with a resistor 6, of value R2. A biasing voltage +Vp is applied to the negative input of comparator 1 through a resistor 7 and a diode 8.

With this circuit it is sought to determine the arrival time of the pulse after reception thereof, without waiting for it to reach its peak value. In this case, the so-called detection time is then less than the rise time tr.

Thus, the DAC device of FIG. 3 is much less sensitive to the multipaths than the previously described device and gives better accuracy of measurement, which accuracy is required when the aircraft is in approach and/or landing mode where as it happens the effect of the multipaths may be considerable and harmful.

In this device, the pulse which is applied to input E is shown by the signal B in FIG. 4 which gives the amplitude-time diagram of the different signals used in the device. This pulse is on the one hand attenuated, signal F, by the resistive divider bridge 5-6 (R1, R2) and applied to the negative input of the comparator and on the other hand delayed in line 3 (signal C) by a relatively short time td before being applied to the positive input of the comparator. The crossing point D of the attenuated pulse F and the non-attenuated delayed pulse C gives the arrival time ta of the received pulse.

To avoid the comparator from being triggered by the noise which, because of the attenuation $k=R2/(R1+R2)$, is greater at the non-inverting, i.e. positive, input than at the inverting, i.e. negative, input, there is applied to this latter a protection-biasing voltage $V_p$ whose amplitude is slightly greater than the amplitude of the noise, with the desired protection level. It will be noted that a non-inverting input in a comparator is the one which, receiving a signal of a given sign, corresponds to an output delivering a signal of the same sign.

It has been established that with the DAC device the effect of the parasite reflections due to the multipaths only occurs for a very short time, considerably less than time ta marking the arrival time of the pulse.

This DAC device improves then the problem of determining the arrival time of a pulse by reducing the effect of the multipaths with respect to a circuit of the peak-detector type. For a given rise time of the pulses to be received the parameters of the device, i.e. the delay td and the attenuation k, are chosen accordingly.

It is then necessary to consider how this given DAC device reacts generally for pulses having a rise time less than 2.5 µs when there is applied thereto a pulse having a relatively large rise time, for example of the order of or greater than 2.5 µs. FIG. 5 gives a diagram with respect to time of the response of the DAC device for two pulses having different rise times. Signal C1 is the pulse with a short rise time delayed by time td, signal F1 is the non-delayed attenuated pulse. Signal C2 is the pulse with a long delayed rise time and F2 the corresponding non-delayed attenuated pulse. Points D1 and D2 characterize respectively the arrival times ta of the two pulses and it can be seen that the levels A1 and A2 at which the decision must be taken are different; the level at which the decision is obtained on the slow pulse C2, i.e. A2, is considerably less than level A1 relative to the fast pulse C1.

This result has troublesome consequences when the determination device may or must be used with the two sorts of pulses. This case is that of a so-called precision DME operating in the approach or landing phase of an aircraft and which may nevertheless receive slow pulses of the type used at present in a so-called en route DME, in which accuracy plays a less important role. With the DAC circuit described, the proper operation of the device with a slow pulse requires a signal-to-noise ratio greater than the signal-to-noise ratio of the fast pulse since the level where the determination of the arrival time of the slow pulse C2, i.e. A2, takes place is lower than level A1. There is loss of sensitivity in the case of reception of the pulses with a slow rise time.

Furthermore, the passband of the receiver is calculated for transmission of the fast pulse, i.e. that it is much wider than necessary for the reception of a slow pulse, thus causing a signal-to-noise ratio loss for this pulse.

SUMMARY OF THE INVENTION

An object of the present invention is to define a device for determining the arrival time of pulses having different rising fronts which escapes the above-mentioned drawbacks.

Another object of the present invention is to improve the behavior of the device with regard to false triggering by noise.

According to the invention, a device for determining the arrival time of pulses, comprises first comparator means receiving at one input a video pulse whose arrival time it is desired to determine and which is delayed by a definite time, and at another input, this non-delayed but attenuated pulse, these means delivering time information corresponding to the crossing point of the two pulses situated at a level greater than a threshold voltage defining the maximum noise level of the device is characterized in that it further comprises second comparison means connected in parallel across the first through an AND logic circuit, and means for acting on the noise and/or the signal which it receives connected between the input of the device and an input of the second comparison means whose other input is connected to a biasing voltage source, the logic circuit delivering a pulse marking the arrival time, depending on the case, of a pulse with a fast rising front or a pulse with a slow rising front.

DESCRIPTION OF THE DRAWINGS

Other advantages and characteristics of the invention will appear from the description of embodiments, given with reference, apart from FIGS. 1 to 5 relative to the prior art, to figures which show:

FIG. 6, one embodiment of the device of the invention;

FIGS. 7a to e, a diagram with respect to time showing the operation of the device for a fast pulse;

FIGS. 8a to e, a diagram with respect to time showing the operation of the device for a slow pulse;

FIG. 9, another embodiment of the device of the invention;

FIGS. 10a to e, a diagram with respect to time showing the operation of the device according to the embodiment of FIG. 9;

FIGS. 11 and 12, diagrams showing the improvement obtained against false triggering by noise;

FIGS. 13 and 14, diagrams showing how the circuit of FIG. 9 allows the decision level to be chosen on the slow pulse;

FIG. 15, a schematical diagram of an onboard DME interrogator incorporating the device of the invention; and FIG. 16, a schematical diagram of a ground DME transponder incorporating the device of the invention.

DESCRIPTION OF THE PREFERRED EMBODIMENTS

As was defined in the introduction to the present description, the invention proposes providing a device for determining the arrival times of pulses having different rising fronts, some being called fast, the others slow and also in this connection to improve protection against false triggering due to noise. This device must operate whatever the type of pulse which is presented at its input, and this without switching, that is to say that it must ensure this determination for fast pulses without reduction of the passband and for slow pulses with a generally reduced passband. In this case, for pulses having a slow rising front the device will operate with a weaker signal-to-noise ratio than the DAC circuit of the prior art to which a slow pulse is applied.

Another advantage, in the case of the application of a slow pulse such as used in an "en route" DME, is that the gain in signal-to-noise ratio obtained allows an increase in the distance covered for a given power at emission; it also allows the emitted power to be reduced for a given distance, in comparison with a DAC circuit of the prior art.

FIG. 6 shows the device of the invention.

It comprises a first comparator 1 fed from its input E, which may be the output of a video detector in the case of use in electromagnetic detection equipment or distance-measuring equipment, through two branches, a first one comprising a delay line 3 connected to the positive terminal of comparator 1 and a second one comprising an array of resistors 5 and 6, or R1 and R2, wired up as a voltage divider, connected to the negative or inverting terminal of the comparator 1. The output of this comparator 1 is connected to the input 16 of a logic AND circuit 14 whose output S is that of the device. This device also comprises a second comparator 9 connected in parallel across the first one through the AND circuit 14 and fed from input E, through a branch comprising a filtering array 10, formed in a variant of FIG. 6 by a resistor 11 and a capacitor 12, i.e. R and C, forming a low-pass filter and connected to the positive terminal of the comparator, whose negative terminal is connected to a biasing source Vp through the connection 13. The output of comparator 9 is connected to the second input 17 of the AND logic circuit 14.

It will be noted that the first part of the device of the invention, i.e. comparator 1 and its connections, is similar to the DAC device of FIG. 2. We find therein in fact the delay line 3 providing a delay td for the pulse which is applied thereto and the array R1R2 of resistors 5 and 6 which provides an attenuation $$k=R2/(R1+R2)<1$$

to the pulse which is applied thereto.

The device of the invention, such as shown in FIG. 6, must operate correctly whatever the type of pulse which is applied to its input E, i.e. whether this pulse is fast or whether it is slow. There must then be provided for this device at least two operating modes, depending on whether the pulse received presents for example a fast rise time less than 1 μs for example or a slow rise time between 1 and 3 μs.

When there is no video signal output by the detector circuit 15, i.e. when the circuit is not receiving a pulse, there only exists at the input of the device the noise, in this case from the receiver, transmitted by detector 15. This noise is applied to the positive inputs of comparators 1 and 9 and is attenuated in the ratio k at the negative input of comparator 1. This comparator is thus very often triggered by the noise and its level swings continually between logic 1 and 0.

The value of the biasing voltage Vp of the source connected through 13 to the negative input of comparator 9 is adjusted above the value of the noise, attenuated however by the RC filter 10 and therefore the output level of comparator 9 is low, i.e. a logic 0.

The AND gate 14, when it receives at its inputs 16, 17 a signal 1 and a signal 0 has its output at level 0, and the device of the invention delivers no information. In the preferential use contemplated, this output is connected to a decoder of the DME, which in this case receives no information.

In what follows, the operation of the device will be described when it receives a video pulse whose rise time is fast, i.e. when tr is less than 1 μs according to the assumptions made.

This video pulse is delayed, on the one hand, by a time td in the delay line then is applied to the non-inverting, i.e. positive, input of comparator 1. This non-delayed pulse attenuated however by a coefficient k<1 is applied to the inverting, i.e. negative, input of comparator 1 as well.

FIG. 7a shows with respect to time the trend of the signals applied to comparator 1 of the device of the invention; curve C1 shows the rapid delayed pulse and curve F1 this pulse attenuated but not delayed.

In the absence of a video pulse, as was mentioned the output of comparator 1 is at its high level in general, i.e. logic 1. After reception of the video pulse, when the attenuated but non-delayed pulse F1 presents an amplitude greater than the delayed pulse C1 (FIG. 7a), the output of comparator 1 charges state and goes to the low level, i.e. logic 0. This state is maintained until the time when the delayed pulse C1 becomes equal in amplitude, point D1, to the non-delayed but attenuated pulse F1. At that time, comparator 1 changes state and its output goes again to its high level. This time, abscissa of the point D1 on the time axis t, i.e. ta, characterizes the arrival time of the fast pulse applied to the device. This arrival time will be delivered by the device of the invention and so received by the decoder connected at the output of the AND circuit 14 as defining the passage from level 0 to level 1 of the output S, if the AND gate 14 lets this pulse pass through; for this, it is necessary for its input 17 to be also at the high level and so the output of comparator 9 must also be at the high level at that time. This state is obtained when the video signal, curve C11 in FIG. 7b, which passes through the RC cell 10 exceeds in level the threshold voltage Vp (point D11). With this RC circuit forming an integrator, it reduces the rise time of the fast pulse C1 which is applied to comparator 9 and also filters the noise in this channel. The time constant RC is calculated so that the pulse C10, whose rising front is thus extended by the RC cell 10, crosses the threshold Vp, at point D11 before the output 16 of comparator 1 goes over to state 1. Thus, when the outputs 16 (curve of FIG. 7c) and 17 (curve of FIG. 7d) of the AND circuit 14 are at level 1, the output S delivers a pulse indicating the arrival time ta of the fast pulse (FIG. 7e), at point 1.

In the following, the operation of the device of the invention will be described when the pulse applied has a slow rise time, i.e. according to the assumptions made, when the rise time tr is between 1 and 3 μs. Generally it is equal to 2.5 μs. The curves of FIGS. 8a to 8e will better help this operation to be understood.

Before the arrival of the slow pulse applied to input E of the device, the output 16 of comparator 1 is at level 1. After the arrival of the pulse, the negative input of the comparator receives the attenuated, non-delayed video pulse whose amplitude exceeds that of the delayed pulse C2 applied to the non-inverting, i.e. positive, input (FIG. 8a). The output 16 of the comparator 1 is then at level 0. However the delayed pulse C2 rapidly exceeds in amplitude the attenuated pulse F2 and therefore the output 16 passes again to level 1 (curve 8c). However the information available at the output of comparator 1 cannot pass through the AND gate 14, whose second input 17 is at level 0. As the threshold Vp (FIG. 8b) at the inverting, i.e. negative, input of comparator 9 is adjusted higher than the level of the crossing point D3 of the slow signals C2 and F2 at the input of comparator 1, the output of comparator 9 remains at the low level up to to moment when the video pulse C21 once through the RC filter 10 exceeds the threshold Vp (curve 8b), point D30.

At that moment, the output 17 of comparator 9 goes to level 1, (curve 8d), and the output S of the AND gate 14 and so of the device delivers a pulse (curve 8e) which is fed to the decoder of the DME equipment in the case where the device is integrated with this equipment, this pulse determining the arrival time of the slow pulse considered.

Thus the determination of the arrival time of the slow pulse is effected not by comparator 1 but by comparator 9 whose positive non-inverting input receives the video signal through an RC filter 10 whose passband at −3 dB will be matched to the minimum and maximum value of the pulses to be received in the case of use in a DME.

With respect to the intermediate-frequency passband from 2 to 4 MHz of the receiver of a DME, this RC filtering circuit ensures a reduction of several dB of the noise in this channel. So the detection of the slow pulse is accomplished under conditions favorable to this type of pulse (narrow video passband).

If we compare the results obtained with the device of the invention with those of the DAC circuit of FIG. 3, it can be seen that for this latter for example taken with parameters $td=0.3$ μs, $k=0.5$, $tr=0.6$ μs ($T=0.8$ μs for a linear rise 0 to 1) determination of the arrival time of a fast pulse is obtained at a level of the order of 0.38 of the maximum amplitude of the delayed non-attenuated fast pulse whereas determination of the arrival time of a slow pulse having a rise time of the order of 2.5 μs is obtained at a level of 0.13 of the maximum amplitude on the delayed and non-attenuated pulse, the protection threshold Vp bein chosen slightly above this value, i.e. at 0.15 of the maximum amplitude.

Thus, to ensure protection against the noise peaks at $2\sigma$, the value $1\sigma$ of the noise must not exceed 0.075A maximum, $\sigma$ representing the effective value of the noise.

The DAC circuit of the prior art requires for correct operation a signal/noise ratio of:

(A max/0.075A max)=13.33 or 22.5 dB.

With the device of the invention, the determination of the arrival time of the fast pulse is effected under the same conditions as with the DAC device, i.e. at 0.38 of the maximum amplitude and the determination of the arrival time of the slow pulse will be obtained at the threshold level adjusted to 0.15 of the maximum amplitude. The RC filter whose passband is of the order of 320 kHz reduces the power of the noise with respect to the noise in a 4 MHz passband required for the transmission of the fast signal, in a ratio of 4, or a ratio of 2 in amplitude (6 dB).

The signal-to-noise ratio taken with respect to the comparison threshold 0.15A before the RC filter may be taken equal to 1 so as to provide a $2\sigma$ level protection at the input of comparator 9. In this case, the minimum signal-to-noise ratio with which the device is capable of operating is:

(S/N)=(A max/0.15A max)=6.67 or:16.5 dB

The comparison of the two S/N ratios at the output of detector 15 (FIG. 6) shows a gain of (22.5−16.6)=6 dB in favor of the device of the invention.

These 6 dB allow either an equivalent reduction of the order of 4 times in the power of the emitter for a given range, or an increase of about twice of the range of the emitter for a given power, with respect to a DAC circuit of FIG. 3. But most often, the gain obtained with respect to noise will be used for a better protection against false triggering by noise.

We have seen in the device of the invention, described with reference to FIG. 6, that comparator 9, associated with comparator 1 for processing in the same device pulses with a short rising front and pulses with a longer rising front, was fed through a circuit acting generally on the noise, so as, principally in the case of the determination of the arrival time of a slow pulse, to improve the signal-to-noise ratio and to match the passband of the device to the smaller one required for transmission of the slow pulse.

This circuit for acting on the signal-to-noise ratio is, in the device of FIG. 6, an RC circuit formed of resistor 11 and capacitor 12.

There are cases where it is not desired to reduce the passband of comparator 9, but where it is nevertheless desired to obtain a better protection against the noise, so as to avoid false triggering of comparator 9 by noise peaks exceeding the threshold established by the biasing voltage Vp and where generally selection of a higher decision point of the slow pulse is desired. In this case, a modified version of FIG. 6 will be used.

FIG. 9 takes up again FIG. 6 in which the RC assembly 10 is replaced by a voltage divider formed by resistor 11 of value R and a resistor 18 of value R3, connected in parallel across capacitor C. It should be noted that, since this latter plays a less important role, it may at the limit be omitted.

Thus, assuming that capacitor C is omitted, comparator 9 is connected to a voltage divider having an attenuation coefficient $$k2=R3/(R+R3)<1$$

This attenuator does not act on the video passband of the device, but the video signal, in this case the pulse applied to the input E of the device which is also applied to comparator 9, undergoes an attenuation in the ratio k2. This attenuation also lessens the amplitude of the noise at the positive input of comparator 9. Since the threshold voltage Vp is not modified, it may be noted that protection against premature triggering of comparator 9 by noise peaks whose amplitude exceeds that of the threshold is increased and this in the ratio 1/k2.

This advantageous arrangement does not adversely affect the determination of the arrival time of a pulse with a fast rising front which is, as we saw above, effected by comparator 1 under the control of comparator 9. In fact, the introduction of resistor R3 in parallel across capacitor C, and also if the capacitor is omitted, has no action on the level of threshold Vp which remains selected, in accordance with the invention, at a level lower than that of the crossing point D1 of the delayed pulse and of the attenuated but non-delayed pulse, applied to the inputs of comparator 1. Indeed, under these conditions comparator 9 will always be at logic level 1 before comparator 1 goes to level 1. The AND gate 14 therefore will deliver a pulse marking the time of arrival of the pulse applied to the input E of the device.

FIGS. 10a to e help the operation of the device of FIG. 9 to be better understood.

In FIG. 10a, relative to comparator 1, there has been shown the pulse with fast rising front C1 delayed by time td and the non-delayed pulse F1 attenuated by the divider circuit R1, R2, which intercepts the preceding one at point D1 marking the time of arrival of the pulse. By N is designated the amplitude of the noise, corresponding to what is called the effective level of the noise $1\sigma$; by Vp is designated the threshold voltage and by Ao the voltage at the crossing point which may also be called decision amplitude.

FIG. 10b gives the pulse leaving comparator 1.

In FIG. 10c, relative to comparator 9, there is shown the pulse F2 which is the one inputted but attenuated in the ratio k2 by the divider circuit R, R3. There is also shown the threshold Vp and the level k2N which is the attenuated amplitude of the noise. FIG. 10d shows the output pulse from comparator 9 at time ts and FIG. 10e the output pulse from the device of the invention.

The ratio between the amplitude of the threshold protection voltage Vp which is then the protection threshold and the amplitude of noise N at $1\sigma$, unit of effective noise level, determines the rate of protection against triggering by the noise. For comparator 1 considered alone, this ratio will be:

$$m1 = (Vp/N)$$

For comparator 9 the ratio is:

$$m2 = Vp/k2N$$

k2 being the attenuation coefficient given by the circuit R, R3 (11–18). The gain obtained by the use of comparator 9 may be deduced, which is:

$$G = (m1/m2) = (1/k2)$$

since $k2 < 1$, $G > 1$, so the introduction of resistor R2 produces a considerable improvement in the protection against false triggering by the noise.

By way of example, with the usual values for attenuation k and delay td for comparator 1, the attenuation k2 may be of the order of 0.5 so $1/k2 = 2$ or 6 dB for the gain as regards the protection against false triggering by the noise.

This improvement allows either operation with a smaller signal-to-noise ratio for determining the arrival time of the pulses, while still having very good protection against parasite triggering by the noise, or a greater likelihood of detection without a false alarm for a given signal-to-noise ratio at the video detector 15.

If we consider a DAC circuit of the prior art in which the noise level ($1\sigma$) is 6 dB below the decision level Ao, placing the protection threshold Vp at 1 dB below the decision level Ao, a protection against noise of the order of 5 dB ($Vp = 1.78\sigma$) is obtained.

With the device of the invention (FIG. 9) the attenuation coefficient is of the order of $k2 = 0.5$ and keeping the threshold Vp on comparator 9 at 1 dB below the crossing level Ao (FIG. 10a), the protection level against noise is 11 dB (i.e. $3.55\sigma$). The corresponding gain is $1/k2 = 2$ or 6 dB.

The result is that if a protection of $2\sigma$ giving a 95% probability of non-triggering is satisfactory, it is possible to operate with a lower signal-to-noise ratio.

FIGS. 11 and 12, relative respectively to the device of the prior art and to the device of the invention, the variation of FIG. 9, illustrate the preceding considerations.

In the preceding we considered the case where the pulse applied to the device had a fast rising front. In what follows the application of a pulse with slow rising front will be considered.

In this case, as for the device of FIG. 6, the decision will be obtained by comparator 9 which then reduces the amplitude of the video signal which is applied thereto in the ratio k2 less than 1, for a value of the threshold voltage Vp which remains unchanged. Thus is obtained determination of the arrival time of the pulse with slow rising front at a higher level on the rising front of the pulse, as shown in FIG. 13, where through the attenuation provided by the circuit R, R3 R3R, the maximum amplitude reached by the pulse is of the order of A/2 whereas it is A in the case of FIG. 14 where the circuit acting on the noise is an RC circuit (FIG. 6).

Thus, when comparator 9 is fed through an RC circuit, the video passband may be matched to the slow rising front of the pulse.

When comparator 9 is fed through an attenuating circuit ($k2 < 1$) the determination of the arrival time of a slow pulse may be effected at a higher level on the pulse, for example at "mid-height" (FIG. 13) which is often taken as the reference level in many systems. However, in this case the video passband remains wide, i.e. unmatched to the band of the slow pulse.

However, it is possible to include the capacitor which, since it is in parallel across resistor R3, allows, as for the preceding case, the video passband to be reduced for this slow rising front pulse.

Thus has been described a device for the accurate determination of the arrival time of a pulse with fast rising front and of a pulse with slow rising front. This accurate determination is particularly advantageous, as has already been mentioned, in distance-measuring equipment where this measurement is accomplished from the knowledge of the time taken by a pulse to travel between two points.

This particularly advantageous application is for distance-measuring equipment, better known under the abbreviation landing DME (distance-measuring equipment) which was defined when the package knowledge of the distance from an aircraft to an airport, or more exactly the distance at which an aircraft in its approach phase is from its landing point, proved to be more and more urgent because, on the one hand, of the increased speed of aircraft and, on the other hand, the increase in the density of aircraft in flight paths and in the approaches to airports.

En route DME equipment is known for which a slightly smaller accuracy is satisfactory, and which use prior-art devices for pulse arrival time determination. To comply with present requirements for accuracy, pulse arrival time determination devices of the invention are incorporated in distance-measuring equipment.

FIG. 15 shows in a simplified way so-called interrogating DME equipment placed onboard an aircraft.

It includes an antenna 19 connected to a receiver 20 and to a transmitter 21 through a duplexer 22 or T/R switch. A frequency synthetizer 23 with a channel selection control 24 is connected to receiver 20 and to transmitter 21. This transmitter is controlled by a coding and modulating circuit 25 for which the interrogation mode 26 may be selected. Receiver 20, which is not shown in detail and comprises the video detector stage, is connected to circuit 31 which is the device for determining pulse times in accordance with the invention. This circuit 31 is connected to a decoding circuit 30 which feeds a distance counter and a processor 27 delivering at 28 the distance and at 29 the speed of movement. Furthermore, coder 25 is connected to counter 27.

FIG. 16 also shows in the form of a simplified diagram a DME ground station, a transponder.

It comprises principally an antenna 32 connected through a duplexer 33 to a receiver 34 and to a transmitter 35 fed by a modulator 36. Receiver 34 is connected to a circuit 37 which is the device of the invention for determining pulse arrival times, circuit 37 which supplies a decoding circuit 38 and a coder connected to a modulator 36; a local oscillator 39 is provided supplying receiver 34 and the assembly 35.

From the operational point of view, the aircraft through its interrogator interrogates the ground station which replies and the interrogator measures the time which elapses between the moment of interrogation and the moment when it receives the reply, and converts this time into distance.

The onboard interrogator, through its transmitter 20 and antenna 19 transmits interrogation pulses which are received by the receiver 34 connected to antenna 32. The arrival time of the interrogation pulses is determined by circuit 37 which is connected to the decoder 38. This latter, connected to modulator 36, triggers transmitter 35 which sends back to the interrogator response pulses.

These pulses are picked up by the antenna 19 of the interrogator, processed in receiver 20 and their exact arrival time detected in circuit 31, connected to decoder 30 and to counter 27. This counter, started up during the transmission of the interrogation pulses, is stopped when the response pulses arrive from the ground station, which arrival is determined accurately by circuit 31 the operation of which has already been described and which will therefore not be described again.

The number of clock pulses counted by counter 27 gives the time taken by these interrogation pulses to effect the round trip to the station, and the distance separating the aircraft from the ground station is deduced therefrom.

It does not seem necessary to give further details of the operation of a DME equipped with the device of the invention for determining pulse arrival times.

By way of novel product, the present application also covers DME equipment in which the devices of the invention are incorporated.

What is claimed is:

1. A device for determining the arrival time of video pules having differing rising edge duration times, said device comprising:
    (a) DAC (Delay And Compare) detector means, for receiving an input pulse signal, for delaying said input pulse signal, for attenuating said input pulse signal and for comparing said delayed signal and said attenuated signal to generate a first comparison signal;
    (b) threshold detector means for receiving said input pulse signal, for filtering said input pulse signal and for comparing said filtered signal and a threshold signal to generate a second comparison signal; and
    (c) coincidence circuit means for receiving said first and second comparison signals and generating an output signal representative of the arrival time of said input pulse signal.

2. The device of claim 1, wherein said threshoold detector means comprises a voltage comparator having a first input connected to a low-pass video filter having a predetermined cut-off frequency and a second input connected to a biasing voltage source.

3. The device of claim 1, wherein said DAC detector means comprises a voltage comparator having a delaying circuit connected to a first input and a voltage divider connected to a second input.

4. A distance measuring equipment (DME) system, comprising an airborne interrogator and a ground transponder having "enroute" and "in approach" operating modes, each one of said interrogator and transponder including, a receiver connected to a video pulse time arrival determination device comprising:
    (a) DAC (Delay and Compare) detector means, for receiving an input pulse signal, for delaying said input pulse signal, for attenuating said input pulse signal and for comparing said delayed signal and said attenuated signal to generate a first comparison signal;
    (b) threshold detector means for receiving said input pulse signal for filtering said input pulse signal and for comparing said filtered signal and a threshold signal to generate a second comparison signal; and
    (c) coincidence circuit means for receiving said first and second comparison signals and generating an output signal representative of the arrival time of said input pulse signal.

5. A distance measuring equipment (DME) system having an airborne interrogator receiver and a ground transponder and having two operating modes, "enroute" and "in approach", said system including a video pulse arrival time determination device connected to the output of the airborne interrogator receiver, said device comprising:
    (a) DAC (Delay and Compare) detector means, for receiving an input pulse signal, for delaying said input pulse signal, for attenuating said input pulse signal and for comparing said delayed signal and said attenuated signal to generate a first comparison signal;
    (b) threshold detector means for receiving said input pulse signal for filtering said input pulse signal and for comparing said filtered signal and a threshold signal to generate a second comparison signal; and
    (c) a coincidence circuit having its input respectively connected to said DAC detector means and threshold detector means outputs for delivering an output signal representative of an arrival time of a response pulse transmitted from said ground transponder.

6. The DME system of claim 5, wherein the output of the video pulse arrival time determination device delivering the arrival time of the response pulse transmitted from said ground transponder is connected to a decoder circuit to reset a counter triggered by a corresponding interrogative signal.

7. A distance measuring equipment (DME) system having an airborne interrogator receiver and a ground transponder and having two operating modes, "enroute" and "in approach", said system including a video pulse arrival time determination device connected to the output of the ground transponder receiver, said device comprising:
    (a) DAC (Delay And Compare) detector means, for receiving an input pulse signal, for delaying said input pulse signal, for attenuating said input pulse signal and for comparing said delayed signal and said attenuated signal to generate a first comparison signal;
    (b) threshold detector means for receiving said input pulse signal for filtering said input pulse signal and for comparing said filtered signal and a threshold signal to generate a second comparison signal; and
    (c) a coincidence circuit having its inputs respectively connected to said DAC detector means and threshold detector means outputs, for delivering an output signal representative of an arrival time of an interrogating pulse transmitted from said airborne interrogator.

8. The DME system of claim 7, wherein the output of the video pulse arrival time determination device is connected to a decoder/encoder circuit to provide a response signal which corresponds to the operative mode of the airborne interrogator.

* * * * *